United States Patent
Huang

(10) Patent No.: US 7,348,848 B2
(45) Date of Patent: Mar. 25, 2008

(54) BUFFER AMPLIFIER FOR SOURCE DRIVER

(75) Inventor: Chun-Chin Huang, Jiayi (TW)

(73) Assignee: DenMOS Technology Inc., Hsinchu (TW)

( * ) Notice: Subject to any disclaimer, the term of this patent is extended or adjusted under 35 U.S.C. 154(b) by 57 days.

(21) Appl. No.: 11/460,614

(22) Filed: Jul. 27, 2006

(65) Prior Publication Data
US 2007/0139111 A1   Jun. 21, 2007

(30) Foreign Application Priority Data
Dec. 19, 2005   (TW) ............................... 94145028 A

(51) Int. Cl.
*H03F 3/45* (2006.01)
(52) U.S. Cl. ...................... 330/253; 330/255
(58) Field of Classification Search ............ 330/253, 330/255, 69, 260
See application file for complete search history.

(56) References Cited

U.S. PATENT DOCUMENTS

| | | | |
|---|---|---|---|
| 5,959,475 A * | 9/1999 | Zomorrodi | 327/112 |
| 6,064,258 A * | 5/2000 | Shulman | 330/9 |
| 6,137,360 A | 10/2000 | Memida | |
| 6,331,846 B1 | 12/2001 | Nakao | |
| 6,812,781 B2 * | 11/2004 | Tsuchiya | 327/563 |
| 7,068,077 B1 * | 6/2006 | Reinschmidt | 326/83 |

FOREIGN PATENT DOCUMENTS

TW   340995   9/1998

* cited by examiner

*Primary Examiner*—Henry Choe
(74) *Attorney, Agent, or Firm*—Jianq Chyun IP Office

(57) ABSTRACT

A buffer amplifier for source driver is disclosed. The buffer amplifier has an N-channel differential amplifier and a P-channel differential amplifier as its input stages so as to achieve rail-to-rail input, and a class AB amplifier to push-pull the output stage so as to achieve rail-to-rail output. The output stage of the buffer amplifier is capable of larger charge/discharge, is faster, and has equal charge/discharge time. More importantly, the buffer amplifier has advantages such as lower power consumption, higher slew rate, and a more stable output.

8 Claims, 7 Drawing Sheets

BUFFER AMPLIFIER FOR SOURCE DRIVER

CROSS-REFERENCE TO RELATED APPLICATION

This application claims the priority benefit of Taiwan application serial no. 94145028, filed on Dec. 19, 2005. All disclosure of the Taiwan application is incorporated herein by reference.

BACKGROUND OF THE INVENTION

1. Field of Invention

The present invention relates to an amplifier for source driver. More particularly, the present invention relates to a buffer amplifier for source driver.

2. Description of Related Art

Nowadays, flat panel displays, for example, such as LCD, have been used widely. Along with the improvement of the semiconductor technology, LCD is known to have such advantages as lower power consumption, smaller size and lighter weight, higher resolution, higher color saturation, and longer lifespan. Thus, LCD is widely applied to electronic products related to our daily lives, such as the use of LCD screens in laptop computers or desktop computers and LCD TVs. In which, the source driver is a critical component of a LCD.

Furthermore, a source driver is further divided into a digital circuit portion and an analog circuit portion. A buffer amplifier, for example, such as an output buffer amplifier or a reference voltage generator, is usually used in the analog circuit portion. Generally, a buffer amplifier, for example, used at an output stage for driving a LCD panel, requires rail-to-rail. In other words, the so-called rail-to-rail input is to mean that the range of the input signal can be from the higher power supply voltage level (referred to as VDD) of the IC to the lower power supply voltage level (referred to as VSS) of the IC. Similarly, the rail-to-rail output is to mean that the range of the output signal can be from VDD to VSS.

A conventional amplifier circuit is disclosed in Taiwan Patent Publication No. 455833 by Sharp Corp., in which a plurality of switches are used for performing DC offset cancellation. However, a larger chip layout area will be consumed by the footprint of the amplifier structure of the aforementioned patent when used as the output buffer. Moreover, the DC offset of the LCD panel to which the amplifier is applied is usually within an acceptable range.

In addition, another conventional amplifier circuit is disclosed in Taiwan Patent Publication No. 340995 by Sharp Corp., in which the amplifier structure can have a dynamic input range. However, the gate of the output NMOSFET (N-type metal oxide semiconductor field effect transistor) in the aforementioned circuit is coupled to a constant bias, which results in an inequality between the charge rate and the discharge rate of the output stage. If the aforementioned circuit is used as a reference voltage generator in a source driver inside a plurality of amplifiers A101 in the circuit shown in FIG. 1, inaccurate voltage levels may be resulted. The aforementioned circuit is formed of the amplifiers A101 and a plurality of resistors R101 as shown in FIG. 1. Moreover, DC power is consumed regularly because the gate of the output NMOS in the circuit is coupled to a constant bias.

SUMMARY OF THE INVENTION

Accordingly, the present invention is directed to provide a buffer amplifier for source driver, which is able to reduce power consumption during use in output buffer amplifier.

According to another aspect of the present invention, a buffer amplifier for source driver is provided, which allows for rail-to-rail input and output signals.

According to yet another aspect of the present invention, a buffer amplifier for source driver is provided, which allows for the charge rate and the discharge rate of the output stage to be equal.

The present invention provides a buffer amplifier for source driver, which includes a first type differential amplifier, a second type differential amplifier, a $1^{st}$ transistor, a $2^{nd}$ transistor, a $3^{rd}$ transistor, a $4^{th}$ transistor, a $5^{th}$ transistor, and a $6^{th}$ transistor. The first type differential amplifier includes a positive input terminal, a negative input terminal, and an output terminal, in which the positive input terminal is used for receiving an input signal. The second type differential amplifier includes a positive input terminal, a negative input terminal, and an output terminal, in which the positive input terminal is used for receiving the input signal and the negative input terminal is coupled to the negative input terminal of the first type differential amplifier. The $1^{st}$ transistor includes a gate, a first source/drain, and a second source/drain, in which the gate is coupled to the output terminal of the first type differential amplifier and the first source/drain is coupled to a first power cord. The $2^{nd}$ transistor includes a gate, a first source/drain, and a second source/drain, in which the gate receives a first bias and the first source/drain is coupled to the second source/drain of the $1^{st}$ transistor. The $3^{rd}$ transistor includes a gate, a first source/drain, and a second source/drain, in which the gate receives a second bias, the first source/drain is coupled to the second source/drain of the $1^{st}$ transistor, and the second source/drain is coupled to the second source/drain of the $2^{nd}$ transistor. The $4^{th}$ transistor includes a gate, a first source/drain, and a second source/drain, in which the gate is coupled to the output terminal of the second type differential amplifier, the first source/drain is coupled to the second source/drain of the $2^{nd}$ transistor, and the second source/drain is coupled to a second power cord. The $5^{th}$ transistor includes a gate, a first source/drain, and a second source/drain, in which the gate is coupled to the first source/drain of the $2^{nd}$ transistor, the first source/drain is coupled to the first power cord, and the second source/drain is coupled to the negative input terminal of the first type differential amplifier. The $6^{th}$ transistor includes a gate, a first source/drain, and a second source/drain, in which the gate is coupled to the second source/drain of the $2^{nd}$ transistor, the first source/drain is coupled to the second power cord, and the second source/drain is coupled to the negative input terminal of the first type differential amplifier.

The present invention provides a buffer amplifier for source driver, which includes a first type differential amplifier, a second type differential amplifier, a $1^{st}$ transistor, a $2^{nd}$ transistor, a $3^{rd}$ transistor, a $4^{th}$ transistor, a $5^{th}$ transistor, and a $6^{th}$ transistor. The first type differential amplifier includes a positive input terminal, a negative input terminal, and an output terminal, in which the positive input terminal is used for receiving an input signal. The second type differential amplifier includes a positive input terminal, a negative input terminal, and an output terminal, in which the positive input terminal is used for receiving the input signal, and the negative input terminal is coupled to the negative input terminal of the first type differential amplifier. The $1^{st}$ transistor includes a gate, a first source/drain, and a second source/drain, in which the gate is coupled to the output terminal of the first type differential amplifier and the first source/drain is coupled to a first power cord. The $2^{nd}$ transistor includes a gate, a first source/drain, and a second source/drain, in which the gate receives a first bias, and the first source/drain is coupled to the second source/drain of the $1^{st}$ transistor. The $3^{rd}$ transistor includes a gate, a first source/drain, and a second source/drain, in which the gate receives a second bias, and the first source/drain is coupled to the second source/drain of the $2^{nd}$ transistor. The $4^{th}$ transistor includes a gate, a first source/drain, and a second source/drain, in which the gate is coupled to the output terminal of the second type differential amplifier, the first source/drain is coupled to the second source/drain of the $3^{rd}$ transistor, and the second source/drain is coupled to a second power cord. The $5^{th}$ transistor includes a gate, a first source/drain, and a second source/drain, in which the gate is coupled to the first source/drain of the $2^{nd}$ transistor, the first source/drain is coupled to the first power cord, and the second source/drain is coupled to the negative input terminal of the first type differential amplifier. The $6^{th}$ transistor includes a gate, a first source/drain, and a second source/drain, in which the gate is coupled to the second source/drain of the $3^{rd}$ transistor, the first source/drain is coupled to the second power cord, and the second source/drain is coupled to the negative input terminal of the first type differential amplifier.

The present invention provides a buffer amplifier for source driver, which includes a first type differential amplifier, a second type differential amplifier, a $1^{st}$ transistor, a $2^{nd}$ transistor, a $3^{rd}$ transistor, a $4^{th}$ transistor, a $5^{th}$ transistor, and a $6^{th}$ transistor. The first type differential amplifier includes a positive input terminal, a negative input terminal, and an output terminal, in which the positive input terminal is used for receiving an input signal. The second type differential amplifier includes a positive input terminal, a negative input terminal, and an output terminal, in which the positive input terminal is used for receiving the input signal, and the negative input terminal is coupled to the negative input terminal of the first type differential amplifier. The $1^{st}$ transistor includes a gate, a first source/drain, and a second source/drain, in which the gate is coupled to the output terminal of the first type differential amplifier and the first source/drain is coupled to a first power cord. The $2^{nd}$ transistor includes a gate, a first source/drain, and a second source/drain, in which the first source/drain is coupled to the second source/drain of the $1^{st}$ transistor. The $3^{rd}$ transistor includes a gate, a first source/drain, and a second source/drain, in which the first source/drain and the gate are coupled to the second source/drain and the gate of the $2^{nd}$ transistor. The $4^{th}$ transistor includes a gate, a first source/drain, and a second source/drain, in which the gate is coupled to the output terminal of the second type differential amplifier, the first source/drain is coupled to the second source/drain of the $3^{rd}$ transistor, and the second source/drain is coupled to a second power cord. The $5^{th}$ transistor includes a gate, a first source/drain, and a second source/drain, in which the gate is coupled to the first source/drain of the $2^{nd}$ transistor, the first source/drain is coupled to the first power cord, and the second source/drain is coupled to the negative input terminal of the first type differential amplifier. The $6^{th}$ transistor includes a gate, a first source/drain, and a second source/drain, in which the gate is coupled to the second source/drain of the $3^{rd}$ transistor, the first source/drain is coupled to the second power cord, and the second source/drain is coupled to the negative input terminal of the first type differential amplifier.

According to the present invention, an N-type differential amplifier and a P-type differential amplifier are used as the input stages, and a class AB amplifier is used to push-pull the output stage structure, so that rail-to-rail input/output can be achieved by the present invention. The output stage of the buffer amplifier in the present invention possesses such characteristics as higher charge/discharge capability, faster speed, and equal charge/discharge time. Moreover, the buffer amplifier in the present invention has advantages such as lower power consumption, higher slew rate, and a more stable output.

In order to make the aforementioned and other objects, features and advantages of the present invention comprehensible, a preferred embodiment accompanied with figures is described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 2:
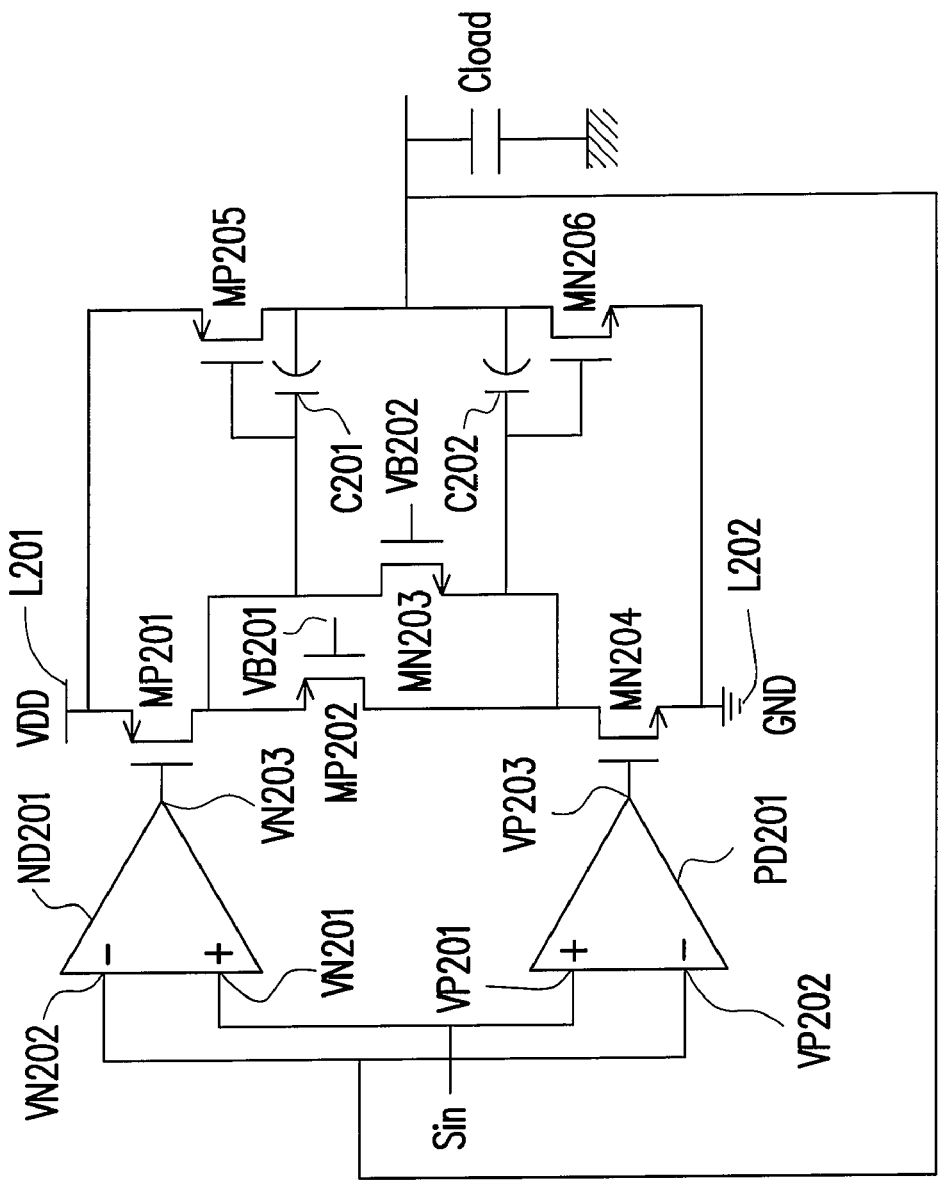
FIG. 2 is a circuit diagram of a buffer amplifier for source driver according to an embodiment of the present invention.

FIG. 2 is a circuit diagram of a buffer amplifier for source driver according to an embodiment of the present invention. Referring to FIG. 2, the buffer amplifier includes an N-type differential amplifier ND201, a P-type differential amplifier PD201, a $1^{st}$ transistor MP201, a $2^{nd}$ transistor MP202, a $3^{rd}$ transistor MN203, a $4^{th}$ transistor MN204, a first capacitor C201, a second capacitor C202, a $5^{th}$ transistor MP205, and a $6^{th}$ transistor MN206.

The N-type differential amplifier ND201 includes a positive input terminal VN201, a negative input terminal VN202, and an output terminal VN203, in which the positive input terminal VN201 is used for receiving an input signal Sin. The P-type differential amplifier includes a positive input terminal VP201, a negative input terminal VP202, and an output terminal VP203, in which the positive input terminal VP201 is used for receiving the input signal Sin, and the negative input terminal VP202 is coupled to the negative input terminal VN202 of the N-type differential amplifier ND201. The gate of the 1$^{st}$ transistor MP201 is coupled to the output terminal VN203 of the N-type differential amplifier ND201. The first source/drain of the 1$^{st}$ transistor MP201 is coupled to a first power cord L201.

The gate of the 2$^{nd}$ transistor MP202 receives a first bias VB201. The first source/drain of the 2$^{nd}$ transistor MP202 is coupled to the second source/drain of the 1$^{st}$ transistor MP201. The gate of the 3$^{rd}$ transistor MN203 receives a second bias VB202. The first source/drain of the 3$^{rd}$ transistor MN203 is coupled to the second source/drain of the 1$^{st}$ transistor MP201. The second source/drain of the 3$^{rd}$ transistor MN203 is coupled to the second source/drain of the 2$^{nd}$ transistor MP202. The gate of the 4$^{th}$ transistor MN204 is coupled to the output terminal VP203 of the P-type differential amplifier PD201. The first source/drain of the 4$^{th}$ transistor MN204 is coupled to the second source/drain of the 2$^{nd}$ transistor MP202. The second source/drain of the 4$^{th}$ transistor MN204 is coupled to the second power cord L202.

The gate of the 5$^{th}$ transistor MP205 is coupled to the first source/drain of the 2$^{nd}$ transistor MP202. The first source/drain of the 5$^{th}$ transistor MP205 is coupled to the first power cord L201. The second source/drain of the 5$^{th}$ transistor MP205 is coupled to the negative input terminal VN202 of the N-type differential amplifier ND201. The gate of the 6$^{th}$ transistor MN206 is coupled to the second source/drain of the 2$^{nd}$ transistor MP202. The first source/drain of the 6$^{th}$ transistor MN206 is coupled to the second power cord L202. The second source/drain of the 6$^{th}$ transistor MN206 is coupled to the negative input terminal VN202 of the N-type differential amplifier ND201. One terminal of the first capacitor C201 is coupled to the second source/drain of the 5$^{th}$ transistor MP205. Another terminal of the first capacitor C201 is coupled to the gate of the 5$^{th}$ transistor MP205. One terminal of the second capacitor C202 is coupled to the second source/drain of the 6$^{th}$ transistor MN206. Another terminal of the second capacitor C202 is coupled to the gate of the 6$^{th}$ transistor MN206.

In the present embodiment, the 1$^{st}$ transistor MP201, the 2$^{nd}$ transistor MP202, and the 5$^{th}$ transistor MP205 are P-type metal oxide semiconductor field effect transistors, and the 3$^{rd}$ transistor MN203, the 4$^{th}$ transistor MN204, and the 6$^{th}$ transistor MN206 are N-type metal oxide semiconductor field effect transistors. The first capacitor C201 and the second capacitor C202 are used for frequency compensation (it should be understood by those skilled in the art that the capacitors C201 and C202 are dispensable). In addition, in the present embodiment, the first power cord L201 is coupled to the higher power supply voltage level VDD of the IC, and the second power cord L202 is coupled to the ground voltage level GND.

When the buffer amplifier of the present embodiment in FIG. 2 is used as the output buffer amplifier of a source driver, it means that the buffer amplifier is used for driving the pixel capacitor $C_{load}$ of the LCD panel. First, assuming that VDD=7V, the voltage level stored in the pixel capacitor $C_{load}$ is 4V, and the input signal Sin is 5V. The voltage level 4V stored in the pixel capacitor $C_{load}$ is fed back to the negative input terminal VN202 of the N-type differential amplifier ND201 and the negative input terminal VP202 of the P-type differential amplifier PD201. The voltage level 4V input to the negative input terminal VN202 of the N-type differential amplifier ND201 is compared with the input signal Sin=5V of the positive input terminal VN201 to output the high voltage level from the output terminal VN203 so that the 1$^{st}$ transistor MP201 is the cut off.

Similarly, the 4V input to the negative input terminal VP202 of the P-type differential amplifier PD201 is compared with the Sin=5V input to the positive input terminal VP201 to output the high voltage level from the output terminal VP203 of the P-type differential amplifier PD201 so that the 4$^{th}$ transistor MN204 is turned on. Through the voltage level shifting of the 2$^{nd}$ transistor MP202 and the 3$^{rd}$ transistor MN203, the nodes A and B are set to lower voltage level; and furthermore, the 5$^{th}$ transistor MP205 is turned on, and the 6$^{th}$ transistor MN6 is cut off. When the capacitor is charged to 5V, the node A is set to higher voltage level and node B is set to lower voltage level through voltage level shifting of the 2$^{nd}$ transistor MP202 and the 3$^{rd}$ transistor MN203.

In another example, assuming that VDD=7V, the voltage level stored in the pixel capacitor $C_{load}$ is 6V, and the input signal Sin is 4V. The voltage level 6V stored in the pixel capacitor $C_{load}$ is fed back to the negative input terminal VN202 of the N-type differential amplifier ND201 and the negative input terminal VP202 of the P-type differential amplifier PD201. The voltage level 6V input to the negative input terminal VN202 of the N-type differential amplifier ND201 is compared with the input signal Sin=4V of the positive input terminal VN201 to output lower voltage level from the output terminal VN203, so that the 1$^{st}$ transistor MP201 is turned on.

Similarly, the voltage level 6V input to the negative input terminal VP202 of the P-type differential amplifier PD201 is compared with the input signal Sin=4V of the positive input terminal VP201 to output the lower voltage level from the output terminal VP203 of the P-type differential amplifier PD201, so that the 4$^{th}$ transistor is cut off. Through the voltage level shifting of the 2$^{nd}$ transistor MP202 and the 3$^{rd}$ transistor MN203, the nodes A and B are set to higher voltage level; and furthermore, the 5$^{th}$ transistor MP205 is turned off, and the 6$^{th}$ transistor MN206 is turned on. When the capacitor is discharged to 4V, the node A is set to higher voltage level and the node B is set to lower voltage level through the voltage level shifting of the 2$^{nd}$ transistor MP202 and the 3$^{rd}$ transistor MN203.

It should be understood from the embodiment described above that rail-to-rail input can be achieved through using an N-type differential amplifier and a P-type differential amplifier as input stages, respectively, and through using a class AB amplifier as the output stage, not only rail-to-rail output can be achieved, but also the output transistors of the output stage amplifier can be turned off when the target voltage has been reached so as to cut electricity consumption.

Figure 3:
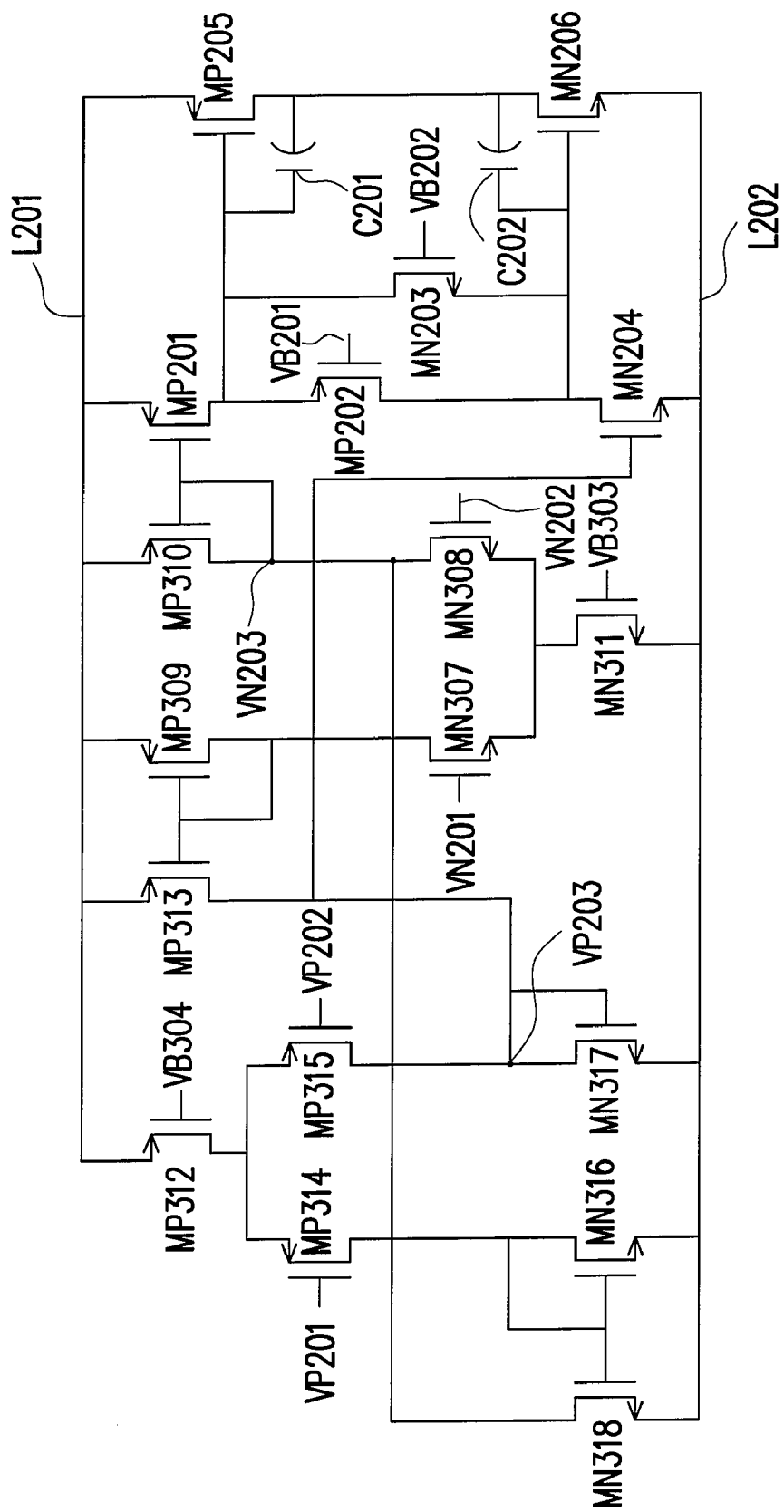
FIG. 3 is a detailed circuit diagram of the buffer amplifier for source driver in FIG. 2 according to an embodiment of the present invention.

FIG. 3 is a detailed circuit diagram of the buffer amplifier for source driver in FIG. 2 according to an embodiment of the present invention. Referring to FIG. 3, the detailed circuits of the N-type differential amplifier ND201 and the P-type differential amplifier PD201 are illustrated, in which the N-type differential amplifier ND201 includes a 7$^{th}$ transistor MN307, an 8$^{th}$ transistor MN308, a 9$^{th}$ transistor MP309, a 10$^{th}$ transistor MP310, and a 11$^{th}$ transistor MN311, the P-type differential amplifier PD201 includes a 12$^{th}$ transistor MP312, a 13$^{th}$ transistor MP313, a 14$^{th}$ transistor MP314, a 15$^{th}$ transistor MP315, a 16$^{th}$ transistor MN316, a 17$^{th}$ transistor MN317, and an 18$^{th}$ transistor MN318. The 7$^{th}$ transistor MN307 and the 8$^{th}$ transistor MN308 are disposed as an N-type differential pair, and the 14$^{th}$ transistor MP314 and the 15$^{th}$ transistor MP315 are disposed as a P-type differential pair.

The gate of the 7$^{th}$ transistor MN307 is the positive input terminal VN201 of the N-type differential amplifier ND201. The gate of the 8$^{th}$ transistor MN308 is the negative input terminal VN202 of the N-type differential amplifier ND201. The first source/drain of the 8$^{th}$ transistor MN308 is coupled to the first source/drain of the 7$^{th}$ transistor MN307. The second source/drain of the 8$^{th}$ transistor MN308 is the output terminal VN203 of the N-type differential amplifier ND201. The first source/drain of the 9$^{th}$ transistor MP309 is coupled to the first power cord L201. The gate and the second source/drain of the 9$^{th}$ transistor MP309 are coupled to the second source/drain of the 7$^{th}$ transistor MN307.

The first source/drain of the 10$^{th}$ transistor MP310 is coupled to the first power cord L201. The gate and the second source/drain of the 10$^{th}$ transistor MP310 are coupled to the second source/drain of the 8$^{th}$ transistor MN308. The gate of the 11$^{th}$ transistor receives a third bias VB303. The first source/drain of the 11$^{th}$ transistor MN311 is coupled to the first source/drain of the 7$^{th}$ transistor MN307. The second source/drain of the 11$^{th}$ transistor MN311 is coupled to the second power cord L202.

The gate of the 12$^{th}$ transistor MP312 receives a fourth bias VB304. The first source/drain of the 12$^{th}$ transistor MP312 is coupled to the first power cord L201. The first source/drain of the 13$^{th}$ transistor MP313 is coupled to the first power cord L201. The gate of the 13$^{th}$ transistor MP313 is coupled to the gate of the 9$^{th}$ transistor MP309. The gate of the 14$^{th}$ transistor MP314 is the positive input terminal VP201 of the P-type differential amplifier PD201. The first source/drain of the 14$^{th}$ transistor MP314 is coupled to the second source/drain of the 12$^{th}$ transistor MP312. The gate of the 15$^{th}$ transistor MP315 is the negative input terminal VP202 of the P-type differential amplifier PD201. The first source/drain of the 15$^{th}$ transistor MP315 is coupled to the second source/drain of the 12$^{th}$ transistor MP312. The second source/drain of the 15$^{th}$ transistor MP315 is coupled to the second source/drain of the 13$^{th}$ transistor MP313. The second source/drain of the 15$^{th}$ transistor MP315 is the output terminal VP203 of the P-type differential amplifier PD201.

The gate and the second source/drain of the 16$^{th}$ transistor MN316 are coupled to the second source/drain of the 14$^{th}$ transistor MP314. The first source/drain of the 16$^{th}$ transistor MN316 is coupled to the second power cord L202. The gate and the second source/drain of the 17$^{th}$ transistor MN317 are coupled to the second source/drain of the 15$^{th}$ transistor MP315. The first source/drain of the 17$^{th}$ transistor MN317 is coupled to the second power cord L202. The gate of the 18$^{th}$ transistor MN318 is coupled to the gate of the 16$^{th}$ transistor MN316. The first source/drain of the 18$^{th}$ transistor MN318 is coupled to the second power cord L202. The second source/drain of the 18$^{th}$ transistor MN318 is coupled to the second source/drain of the 8$^{th}$ transistor MN308.

Figure 4:
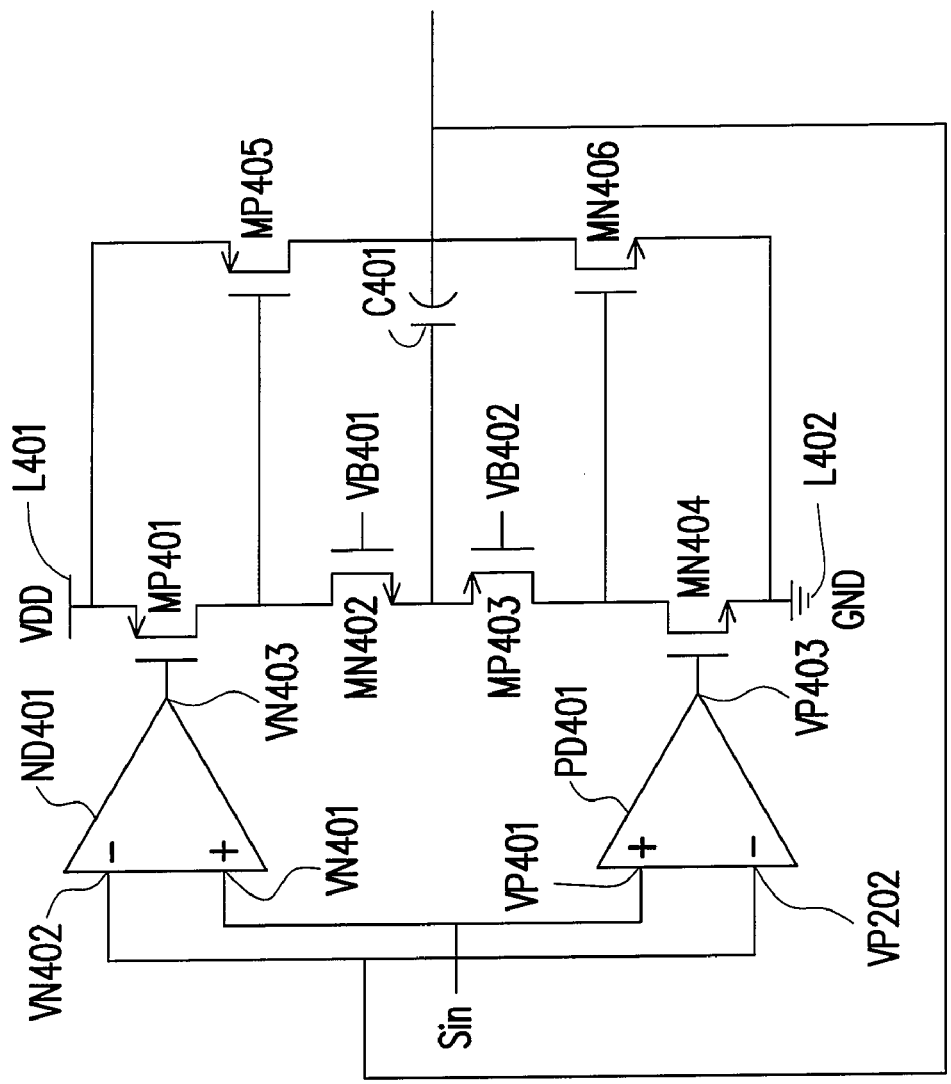
FIG. 4 is a circuit diagram of a buffer amplifier for source driver according to another embodiment of the present invention.

FIG. 4 is a circuit diagram of a buffer amplifier for source driver according to another embodiment of the present invention. The buffer amplifier includes an N-type differential amplifier ND401, a P-type differential amplifier PD401, a capacitor C401, a 1$^{st}$ transistor MP401, a 2$^{nd}$ transistor MN402, a 3$^{rd}$ transistor MP403, a 4$^{th}$ transistor MN404, a 5$^{th}$ transistor MP405, and a 6$^{th}$ transistor MN406. In the present embodiment, the 1$^{st}$ transistor MP401, the 3$^{rd}$ transistor MP403, and the 5$^{th}$ transistor MP405 are P-type metal oxide semiconductor field effect transistors, and the 2$^{nd}$ transistor MN402, the 4$^{th}$ transistor MN404, and the 6$^{th}$ transistor MN406 are N-type metal oxide semiconductor field effect transistors. The capacitor C401 is used for frequency compensation (it should be recognized by those skilled in the art that the capacitor C401 is dispensable).

The N-type differential amplifier ND401 includes a positive input terminal VN401, a negative input terminal VN402, and an output terminal VN403. The positive input terminal VN401 of the N-type differential amplifier ND401 is used for receiving an input signal Sin. The P-type differential amplifier PD401 includes a positive input terminal VP401, a negative input terminal VP402, and an output terminal VP403. The positive input terminal VP401 of the P-type differential amplifier PD401 is used for receiving the input signal Sin. The negative input terminal VP402 of the P-type differential amplifier PD401 is coupled to the negative input terminal VN402 of the N-type differential amplifier ND401. The gate of the 1$^{st}$ transistor MP401 is coupled to the output terminal VN403 of the N-type differential amplifier ND401. The first source/drain of the 1$^{st}$ transistor MP401 is coupled to the first power cord L401.

The gate of the 2$^{nd}$ transistor MN402 receives a first bias VB401. The first source/drain of the 2$^{nd}$ transistor MN402 is coupled to the second source/drain of the 1$^{st}$ transistor MP401. The gate of the 3$^{rd}$ transistor MP403 receives a second bias VB402. The first source/drain of the 3$^{rd}$ transistor MP403 is coupled to the second source/drain of the 2$^{nd}$ transistor MN402. The gate of the 4$^{th}$ transistor MN404 is coupled to the output terminal VP403 of the P-type differential amplifier PD401. The first source/drain of the 4$^{th}$ transistor is coupled to the second source/drain of the 3$^{rd}$ transistor MP403. The 2$^{nd}$ source/drain of the 4$^{th}$ transistor MN404 is coupled to the second power cord L401.

The gate of the 5$^{th}$ transistor MP405 is coupled to the first source/drain of the 2$^{nd}$ transistor MN402. The first source/drain of the 5$^{th}$ transistor MP405 is coupled to the first power cord L401. The second source/drain of the 5$^{th}$ transistor MP405 is coupled to the negative input terminal VN402 of the N-type differential amplifier ND401. The gate of the 6$^{th}$ transistor MN406 is coupled to the second source/drain of the 3$^{rd}$ transistor MP403. The first source/drain of the 6$^{th}$ transistor MN406 is coupled to the second power cord L402. The second source/drain of the 6$^{th}$ transistor MN406 is coupled to the negative input terminal VN402 of the N-type differential amplifier ND401. One terminal of the capacitor C401 is coupled to the second source/drain of the 5$^{th}$ transistor MP405, and the other terminal thereof is coupled to the second source/drain of the 2$^{nd}$ transistor MN402.

Figure 1:
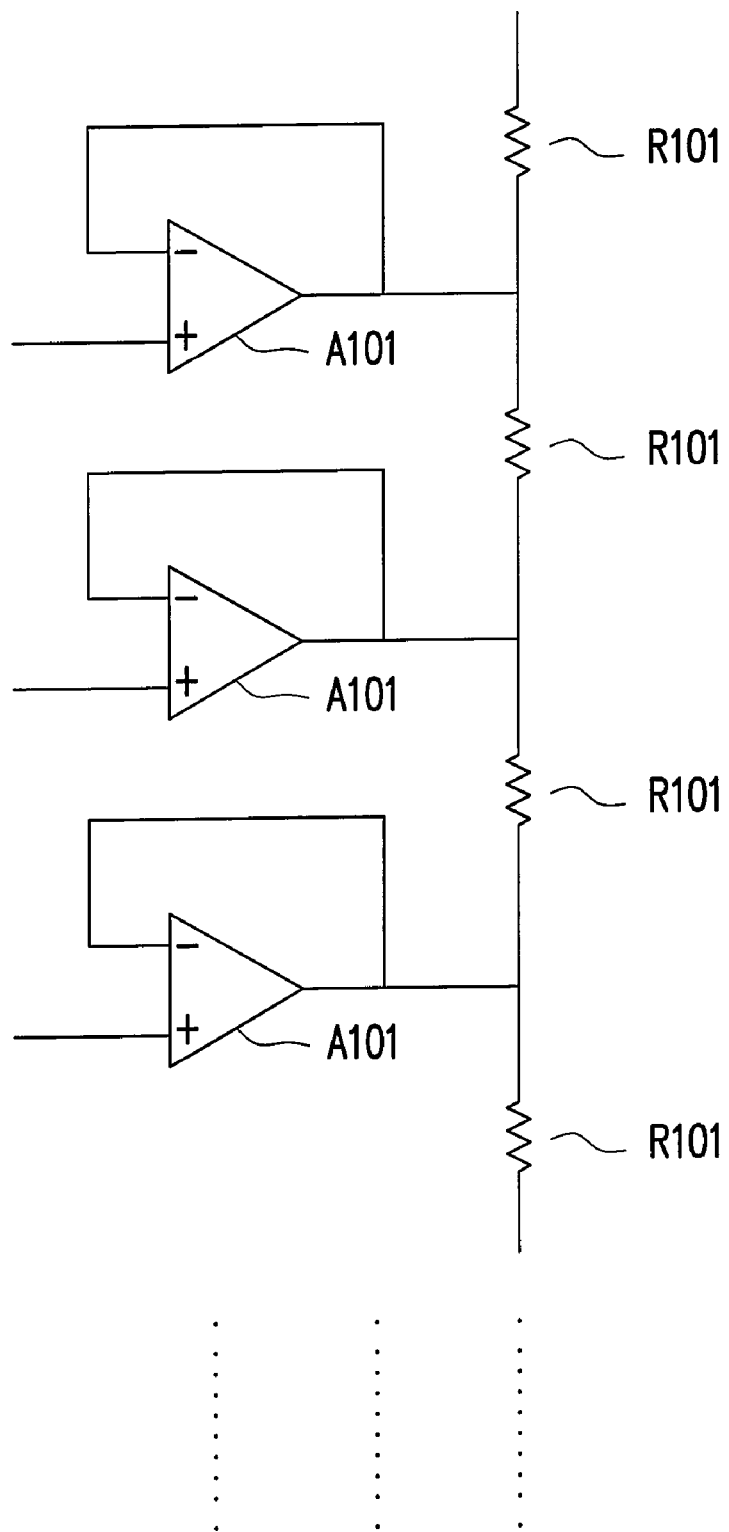
FIG. 1 is a circuit diagram of a conventional reference voltage generator.

In the present embodiment, the first power cord L401 is coupled to the higher power supply voltage level VDD of the IC, and the second power cord L402 is coupled to the ground voltage level GND. In the present circuit, the 2$^{nd}$ transistor MN402 and the 3$^{rd}$ transistor MP403 are used as bias circuits, so that the 5$^{th}$ transistor MP405 and the 6$^{th}$ transistor MN406 can conduct operation in a saturation region. The present circuit can provide current with stable resistance if it is applied to a reference voltage generating circuit in a source driver. For example, the amplifiers A101 in the circuit of FIG. 1, is therefore capable of providing current with stable resistance, thereby providing a stable voltage, and external noises can also be prevented.

Figure 5:
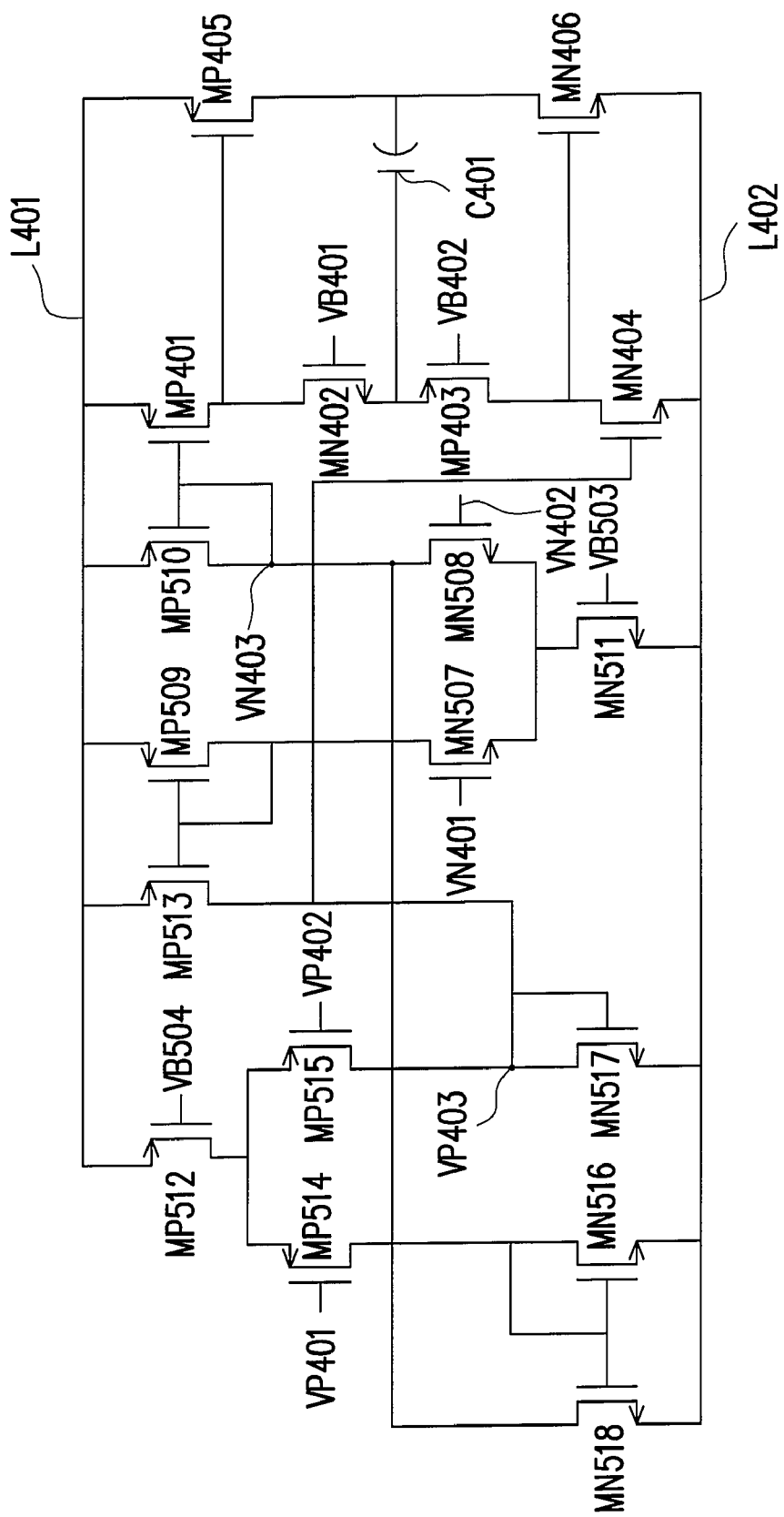
FIG. 5 is a detailed circuit diagram of the buffer amplifier for source driver in FIG. 4 according to an embodiment of the present invention.

FIG. 5 is a detailed circuit diagram of the buffer amplifier for source driver in FIG. 4 according to an embodiment of the present invention. Referring to FIG. 5, the detailed circuits of the N-type differential amplifier ND401 and the P-type differential amplifier PD401 are illustrated in FIG. 5, in which the N-type differential amplifier ND401 includes a 7$^{th}$ transistor MN507, an 8$^{th}$ transistor MN508, a 9$^{th}$ transistor MP509, a 10$^{th}$ transistor MP510, and a 11$^{th}$ transistor MN511, and the P-type differential amplifier PD401 includes a 12$^{th}$ transistor MP512, a 13$^{th}$ transistor MP513, a 14$^{th}$ transistor MP514, a 15$^{th}$ transistor MP515, a 16$^{th}$ transistor MN516, a 17$^{th}$ transistor MN517, and an 18$^{th}$ transistor MN518. The 7$^{th}$ transistor MN507 and the 8$^{th}$ transistor MN508 are disposed as an N-type differential pair, and the 14$^{th}$ transistor MP514 and the 15$^{th}$ transistor MP515 are disposed as a P-type differential pair.

The gate of the 7$^{th}$ transistor MN507 is the positive input terminal VN401 of the N-type differential amplifier ND401. The gate of the 8$^{th}$ transistor MN508 is the negative input terminal VN402 of the N-type differential amplifier ND401. The first source/drain of the 8$^{th}$ transistor MN508 is coupled to the first source/drain of the 7$^{th}$ transistor MN507. The second source/drain of the 8$^{th}$ transistor MN508 is the output terminal VN403 of the N-type differential amplifier ND401. The first source/drain of the 9$^{th}$ transistor MP509 is coupled to the first power cord L401. The gate and the second source/drain of the 9$^{th}$ transistor MP509 are coupled to the second source/drain of the 7$^{th}$ transistor MN507.

The first source/drain of the 10$^{th}$ transistor MP510 is coupled to the first power cord L401. The gate and the second source/drain of the 10$^{th}$ transistor MP510 are coupled to the second source/drain of the 8$^{th}$ transistor MN508. The gate of the 11$^{th}$ transistor MN511 receives a third bias VB503. The first source/drain of the 11$^{th}$ transistor MN511 is coupled to the first source/drain of the 7$^{th}$ transistor MN507. The second source/drain of the 11$^{th}$ transistor MN511 is coupled to the second power cord L402.

The gate of the 12$^{th}$ transistor MP512 receives a fourth bias VB504. The first source/drain of the 12 transistor MP512 is coupled to the first power cord L401. The first source/drain of the 13$^{th}$ transistor MP513 is coupled to the first power cord L401. The gate of the 13$^{th}$ transistor MP513 is coupled to the gate of the 9$^{th}$ transistor MP509. The gate of the 14$^{th}$ transistor MP514 is the positive input terminal VP401 of the P-type differential amplifier PD401. The first source/drain of the 14$^{th}$ transistor MP514 is coupled to the second source/drain of the 12$^{th}$ transistor MP412. The gate of the 15$^{th}$ transistor MP515 is the negative input terminal VP402 of the P-type differential amplifier PD401. The first source/drain of the 15$^{th}$ transistor MP515 is coupled to the second source/drain of the 12$^{th}$ transistor MP512. The second source/drain of the 15$^{th}$ transistor MP515 is coupled to the second source/drain of the 13$^{th}$ transistor MP513. The second source/drain of the 15$^{th}$ transistor MP515 is the output terminal VP403 of the P-type differential amplifier PD401.

The gate and the second source/drain of the 16$^{th}$ transistor MN516 are coupled to the second source/drain of the 14$^{th}$ transistor MP514. The first source/drain of the 16$^{th}$ transistor MN516 is coupled to the second power cord L402. The gate and the second source/drain of the 17$^{th}$ transistor MN517 are coupled to the second source/drain of the 15$^{th}$ transistor MP515. The first source/drain of the 17$^{th}$ transistor MN517 is coupled to the second power cord L402. The gate of the 18$^{th}$ transistor MN518 is coupled to the gate of the 16$^{th}$ transistor MN516. The first source/drain of the 18$^{th}$ transistor MN518 is coupled to the second power cord L402. The second source/drain of the 18$^{th}$ transistor MN518 is coupled to the second source/drain of the 8$^{th}$ transistor MN508.

Figure 6:
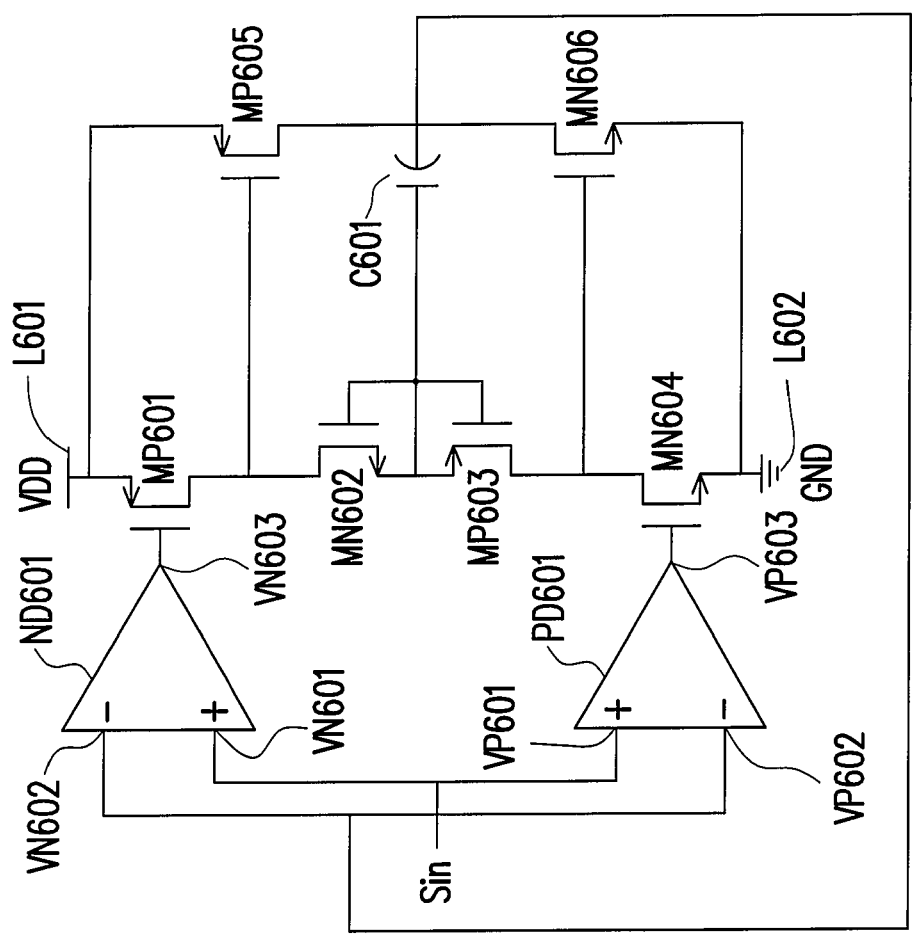
FIG. 6 is a circuit diagram of a buffer amplifier for source driver according to yet another embodiment of the present invention.

Similarly, the circuit in FIG. 6 can also be applied to the reference voltage generating circuit in a source driver, for example, by the amplifiers A101 as shown in FIG. 1. FIG. 6 is a circuit diagram of a buffer amplifier for source driver according to yet another embodiment of the present invention. Referring to FIG. 6, the buffer amplifier includes an N-type differential amplifier ND601, a P-type differential amplifier PD601, a capacitor C601, a 1$^{st}$ transistor MP601, a 2$^{nd}$ transistor MN602, a 3$^{rd}$ transistor MP603, a 4$^{th}$ transistor MN604, a 5$^{th}$ transistor MP605, and a 6$^{th}$ transistor MN606. In the present embodiment, the 1$^{st}$ transistor MP601, the 3$^{rd}$ transistor MP603, and the 5$^{th}$ transistor MP605 are P-type metal oxide semiconductor field effect transistors, and the 2$^{nd}$ transistor MN602, the 4$^{th}$ transistor MN604, and the 6$^{th}$ transistor MN606 are N-type metal oxide semiconductor field effect transistors. The capacitor C601 is used for frequency compensation (it should be understood by those skilled in the art that the capacitor C601 is dispensable).

The N-type differential amplifier ND601 includes a positive input terminal VN601, a negative input terminal VN602, and an output terminal VN603. The positive input terminal VN601 of the N-type differential amplifier ND601 is used for receiving an input signal Sin. The P-type differential amplifier PD601 includes a positive input terminal VP601, a negative input terminal VP602, and an output terminal VP603. The positive input terminal VP601 of the P-type differential amplifier PD601 is used for receiving the input signal Sin. The negative input terminal VP602 of the P-type differential amplifier PD601 is coupled to the negative input terminal VN602 of the N-type differential amplifier ND601. The gate of the 1$^{st}$ transistor MP601 is coupled to the output terminal of the N-type differential amplifier ND601. The first source/drain of the 1$^{st}$ transistor MP601 is coupled to the first power cord L601.

The first source/drain of the 2$^{nd}$ transistor MN602 is coupled to the second source/drain of the 1$^{st}$ transistor MP601. The gate and the first source/drain of the 3$^{rd}$ transistor MP603 are coupled to the second source/drain and the gate of the 2$^{nd}$ transistor MN602. The gate of the 4$^{th}$ transistor MN604 is coupled to the output terminal VP603 of the P-type differential amplifier PD601. The first source/drain of the 4$^{th}$ transistor MN604 is coupled to the second source/drain of the 3$^{rd}$ transistor MP603. The second source/drain of the 4$^{th}$ transistor MN604 is coupled to the second power cord L602.

The gate of the 5$^{th}$ transistor MP605 is coupled to the first source/drain of the 2$^{nd}$ transistor MN602. The first source/drain of the 5$^{th}$ transistor MP605 is coupled to the first power cord L601. The second source/drain of the 5$^{th}$ transistor MP605 is coupled to the negative input terminal VN602 of the N-type differential amplifier ND601. The gate of the 6$^{th}$ transistor MN606 is coupled to the second source/drain of the 3$^{rd}$ transistor MP603. The first source/drain of the 6$^{th}$ transistor MN606 is coupled to the second power cord L602. The second source/drain of the 6$^{th}$ transistor MN606 is coupled to the negative input terminal VN602 of the N-type differential amplifier ND601. One terminal of the capacitor C601 is coupled to the second source/drain of the 5$^{th}$ transistor MP605, and the other terminal thereof is coupled to the second source/drain of the 2$^{nd}$ transistor MN602.

In the present embodiment, the first power cord L601 is coupled to the higher power supply voltage level VDD of the IC, and the second power cord L602 is coupled to the ground voltage level GND. Similarly, in the present circuit, the 5$^{th}$ transistor MP605 and the 6$^{th}$ transistor MN606 can operate in the saturation region with the 2$^{nd}$ transistor MN602 and the 3$^{rd}$ transistor MP603 as bias circuits. If this circuit is applied to a reference voltage generating circuit in a source driver, for example, in the amplifiers A101 in FIG. 1, a current having stable resistance, thereby providing a stable voltage, is provided, and external noises can also be prevented.

Figure 7:
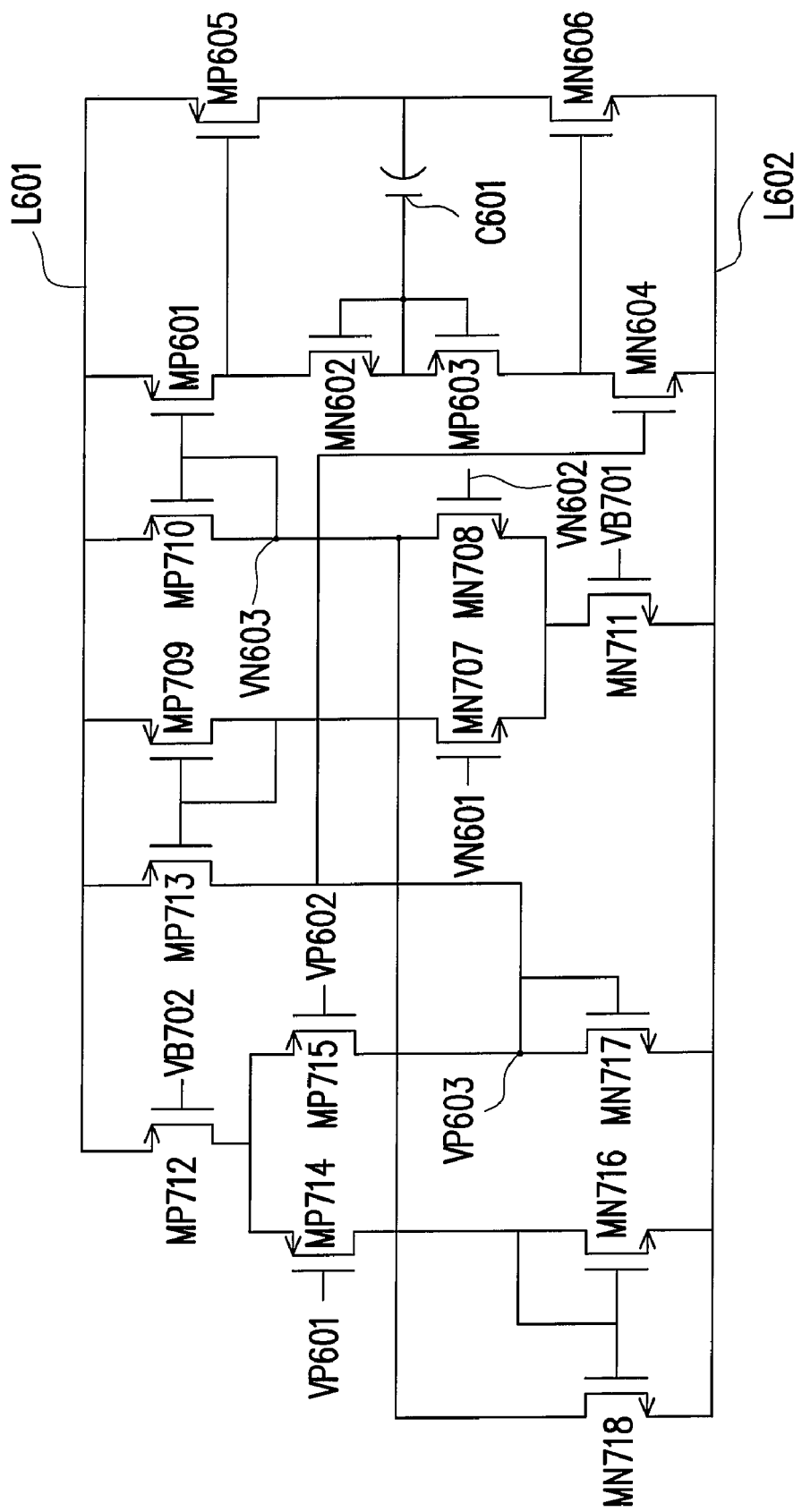
FIG. 7 is a detailed circuit diagram of the buffer amplifier for source driver in FIG. 6 according to the yet another embodiment of the present invention.

FIG. 7 is a detailed circuit diagram of the buffer amplifier for source driver in FIG. 6 according to the yet another embodiment of the present invention. Referring to FIG. 7, the detailed circuits of the N-type differential amplifier ND601 and the P-type differential amplifier PD601 are illustrated, in which the N-type differential amplifier ND601 includes a $7^{th}$ transistor MN707, an $8^{th}$ transistor MN708, a $9^{th}$ transistor MP709, a $10^{th}$ transistor MP710, and a $11^{th}$ transistor MN711, and the P-type differential amplifier PD601 includes a $12^{th}$ transistor MP712, a $13^{th}$ transistor MP713, a $14^{th}$ transistor MP714, a $15^{th}$ transistor MP715, a $16^{th}$ transistor MN716, a $17^{th}$ transistor MN717, and an $18^{th}$ transistor MN718. The $7^{th}$ transistor MN707 and the $8^{th}$ transistor MN708 are disposed as an N-type differential pair, and the $14^{th}$ transistor MP714 and the $15^{th}$ transistor MP715 are disposed as a P-type differential pair.

The gate of the $7^{th}$ transistor MN707 is the positive input terminal VN601 of the N-type differential amplifier ND601. The gate of the $8^{th}$ transistor MN708 is the negative input terminal VN602 of the N-type differential amplifier ND601. The first source/drain of the $8^{th}$ transistor MN708 is coupled to the first source/drain of the $7^{th}$ transistor MN707. The second source/drain of the $8^{th}$ transistor MN708 is the output terminal VN603 of the N-type differential amplifier ND601. The first source/drain of the $9^{th}$ transistor MP709 is coupled to the first power cord L601. The gate and the second source/drain of the $9^{th}$ transistor MP709 are coupled to the second source/drain of the $7^{th}$ transistor MN707.

The first source/drain of the $10^{th}$ transistor MP710 is coupled to the first power cord L601. The gate and the second source/drain of the $10^{th}$ transistor MP710 are coupled to the second source/drain of the $8^{th}$ transistor MN708. The gate of the $11^{th}$ transistor MN711 receives a first bias VB701. The first source/drain of the $11^{th}$ transistor MN711 is coupled to the first source/drain of the $7^{th}$ transistor MN707. The second source/drain of the $11^{th}$ transistor MN711 is coupled to the second power cord L602.

The gate of the $12^{th}$ transistor MP712 receives the second bias VB702. The first source/drain of the $12^{th}$ transistor MP712 is coupled to the first power cord L601. The first source/drain of the $13^{th}$ transistor MP713 is coupled to the first power cord L701. The gate of the $13^{th}$ transistor MP713 is coupled to the gate of the $9^{th}$ transistor MP709. The gate of the $14^{th}$ transistor MP714 is the positive input terminal VP601 of the P-type differential amplifier PD601. The first source/drain of the $14^{th}$ transistor MP714 is coupled to the second source/drain of the $12^{th}$ transistor MP712. The gate of the $15^{th}$ transistor MP715 is the negative input terminal VP602 of the P-type differential amplifier PD601. The first source/drain of the $15^{th}$ transistor MP715 is coupled to the second source/drain of the $12^{th}$ transistor MP712. The second source/drain of the $15^{th}$ transistor MP715 is coupled to the second source/drain of the $13^{th}$ transistor MP713. The second source/drain of the $15^{th}$ transistor MP715 is the output terminal VP603 of the P-type differential amplifier PD601.

The gate and the second source/drain of the $16^{th}$ transistor MN716 are coupled to the second source/drain of the $14^{th}$ transistor MP714. The first source/drain of the $16^{th}$ transistor MN716 is coupled to the second power cord L602. The gate and the second source/drain of the $17^{th}$ transistor MN717 are coupled to the second source/drain of the $15^{th}$ transistor MP715. The first source/drain of the $17^{th}$ transistor MN717 is coupled to the second power cord L602. The gate of the $18^{th}$ transistor MN718 is coupled to the gate of the $16^{th}$ transistor MN716. The first source/drain of the $18^{th}$ transistor MN718 is coupled to the second power cord L602. The second source/drain of the $18^{th}$ transistor MN518 is coupled to the second source/drain of the $8^{th}$ transistor MN708.

In summary, in the present invention, an N-type differential amplifier and a P-type differential amplifier are used as the input stages, and a class AB amplifier is used for push-pulling the output stage structure. Thus, rail-to-rail input/output can be achieved. The output stage of the buffer amplifier in the present invention has such characteristics as faster charge/discharge rates, and equal charge/discharge rates. Moreover, the buffer amplifier in the present invention has advantages such as lower power consumption, higher slew rate, and a more stable output.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A buffer amplifier for source driver, comprising:

a first type differential amplifier, having a positive input terminal, a negative input terminal, and an output terminal, wherein the positive input terminal is for receiving an input signal;

a second type differential amplifier, having a positive input terminal, a negative input terminal, and an output terminal, wherein the positive input terminal is for receiving the input signal, and the negative input terminal is coupled to the negative input terminal of the first type differential amplifier;

a $1^{st}$ transistor, having a gate, a first source/drain, and a second source/drain, wherein the gate is coupled to the output terminal of the first type differential amplifier, and the first source/drain is coupled to a first power cord;

a $2^{nd}$ transistor, having a gate, a first source/drain, and a second source/drain, wherein the gate receives a first bias, and the first source/drain is coupled to the second source/drain of the $1^{st}$ transistor;

a $3^{rd}$ transistor, having a gate, a first source/drain, and a second source/drain, wherein the gate receives a second bias, the first source/drain is coupled to the second source/drain of the $1^{st}$ transistor, and the second source/drain is coupled to the second source/drain of the $2^{nd}$ transistor;

a $4^{th}$ transistor, having a gate, a first source/drain, and a second source/drain, wherein the gate is coupled to the output terminal of the second type differential amplifier, the first source/drain is coupled to the second source/drain of the $2^{nd}$ transistor, and the second source/drain is coupled to a second power cord;

a $5^{th}$ transistor, having a gate, a first source/drain, and a second source/drain, wherein the gate is coupled to the first source/drain of the $2^{nd}$ transistor, the first source/drain is coupled to the first power cord, and the second source/drain is coupled to the negative input terminal of the first type differential amplifier; and a $6^{th}$ transistor, having a gate, a first source/drain, and a second source/drain, wherein the gate is coupled to the second source/drain of the $2^{nd}$ transistor, the first source/drain is coupled to the second power cord, and the second source/drain is coupled to the negative input terminal of the first type differential amplifier.

2. The buffer amplifier as claimed in claim 1, wherein the $1^{st}$ transistor, the $2^{nd}$ transistor, and the $5^{th}$ transistor are P-type metal oxide semiconductor field effect transistors (PMOSFET).

3. The buffer amplifier as claimed in claim 1, wherein the $3^{rd}$ transistor, the $4^{th}$ transistor, and the $6^{th}$ transistor are N-type metal oxide semiconductor field effect transistors (NMOSFET).

4. The buffer amplifier as claimed in claim 1, wherein the input stage differential pair of the first type differential amplifier is a NMOSFET, and the input stage differential pair of the second type differential amplifier is a PMOSFET.

5. The buffer amplifier as claimed in claim 4, wherein the first type differential amplifier comprises:
 an N-type differential pair, comprising:
  a $7^{th}$ transistor, having a gate, a first source/drain, and a second source/drain, wherein the gate is the positive input terminal of the first type differential amplifier; and
  an $8^{th}$ transistor, having a gate, a first source/drain, and a second source/drain, wherein the gate is the negative input terminal of the first type differential amplifier, the first source/drain is coupled to the first source/drain of the $7^{th}$ transistor, the second source/drain is the output terminal of the first type differential amplifier; and
 a $9^{th}$ transistor, having a gate, a first source/drain, and a second source/drain, wherein the first source/drain is coupled to the first power cord, the gate and the second source/drain are coupled to the second source/drain of the $7^{th}$ transistor;
 a $10^{th}$ transistor, having a gate, a first source/drain, and a second source/drain, wherein the first source/drain is coupled to the first power cord, the gate and the second source/drain are coupled to the second source/drain of the $8^{th}$ transistor; and
 a $11^{th}$ transistor, having a gate, a first source/drain, and a second source/drain, wherein the gate receives a third bias, the first source/drain is coupled to the first source/drain of the $7^{th}$ transistor, and the second source/drain is coupled to the second power cord.

6. The buffer amplifier as claimed in claim 5, wherein the second type differential amplifier comprises:
 a $12^{th}$ transistor, having a gate, a first source/drain, and a second source/drain, wherein the gate receives a fourth bias, the first source/drain is coupled to the first power cord;
 a $13^{th}$ transistor, having a gate, a first source/drain, and a second source/drain, wherein the first source/drain is coupled to the first power cord, and the gate is coupled to the gate of the $9^{th}$ transistor;
 a P-type differential pair, comprising:
  a $14^{th}$ transistor, having a gate, a first source/drain, and a second source/drain, wherein the gate is the positive input terminal of the second type differential amplifier, the first source/drain is coupled to the second source/drain of the $12^{th}$ transistor; and
  a $15^{th}$ transistor, having a gate, a first source/drain, and a second source/drain, wherein the gate is the negative input terminal of the second type differential amplifier, the first source/drain is coupled to the second source/drain of the $12^{th}$ transistor, the second source/drain is coupled to the second source/drain of the $13^{th}$ transistor and is the output terminal of the second type differential amplifier; and
 a $16^{th}$ transistor, having a gate, a first source/drain, and a second source/drain, wherein the gate and the second source/drain are coupled to the second source/drain of the $14^{th}$ transistor, and the first source/drain is coupled to the second power cord;
 a $17^{th}$ transistor, having a gate, a first source/drain, and a second source/drain, wherein the gate and the second source/drain are coupled to the second source/drain of the $15^{th}$ transistor, and the first source/drain is coupled to the second power cord; and
 an $18^{th}$ transistor, having a gate, a first source/drain, and a second source/drain, wherein the gate is coupled to the gate of the $16^{th}$ transistor, the first source/drain is coupled to the second power cord, and the second source/drain is coupled to the second source/drain of the $8^{th}$ transistor.

7. The buffer amplifier as claimed in claim 6, wherein the $7^{th}$, $8^{th}$, $11^{th}$, $16^{th}$, $17^{th}$, and the $18^{th}$ transistors are NMOSFETs, and the $9^{th}$, $10^{th}$, $12^{th}$, $13^{th}$, $14^{th}$, and the $15^{th}$ transistors are PMOSFETs.

8. The buffer amplifier as claimed in claim 1, further comprising:
 a first capacitor, having one terminal coupled to the second source/drain of the $5^{th}$ transistor, and another terminal coupled to the gate of the $5^{th}$ transistor; and
 a second transistor, having one terminal coupled to the second source/drain of the $6^{th}$ transistor, and another terminal coupled to the gate of the $6^{th}$ transistor.

* * * * *